United States Patent
Kwag et al.

(10) Patent No.: US 8,632,910 B2
(45) Date of Patent: Jan. 21, 2014

(54) PROTECTION CIRCUIT BOARD, SECONDARY BATTERY AND BATTERY PACK

(75) Inventors: Nohyun Kwag, Suwon-si (KR); Kyungwon Seo, Suwon-si (KR); Seok Koh, Suwon-si (KR); Youngcheol Jang, Suwon-si (KR); Eunok Kwak, Suwon-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 577 days.

(21) Appl. No.: 12/540,279

(22) Filed: Aug. 12, 2009

(65) Prior Publication Data

US 2010/0053835 A1    Mar. 4, 2010

Related U.S. Application Data

(60) Provisional application No. 61/093,958, filed on Sep. 3, 2008.

(51) Int. Cl.
*H01M 2/02* (2006.01)

(52) U.S. Cl.
USPC ............................ 429/178; 429/121; 429/122

(58) Field of Classification Search
USPC ......................................... 429/178, 121, 122
See application file for complete search history.

(56) References Cited

U.S. PATENT DOCUMENTS

| | | |
|---|---|---|
| 2002/0142195 A1 | 10/2002 | Ehara |
| 2003/0003357 A1 | 1/2003 | Tamai et al. |
| 2006/0044728 A1 | 3/2006 | Kim |
| 2006/0071637 A1 | 4/2006 | Heo et al. |
| 2007/0020509 A1 | 1/2007 | Kim |
| 2008/0118820 A1 | 5/2008 | Jang et al. |
| 2009/0123816 A1 | 5/2009 | Jang |

FOREIGN PATENT DOCUMENTS

| | | |
|---|---|---|
| CN | 101188279 | 5/2008 |
| EP | 1 804 314 A2 | 7/2007 |
| EP | 1 919 009 A2 | 5/2008 |
| EP | 1919009 A2 | 5/2008 |
| JP | 2001-351590 | 12/2001 |
| JP | 2002-298809 A | 10/2002 |
| JP | 2003-017022 A | 1/2003 |

(Continued)

OTHER PUBLICATIONS

Office Action dated Jul. 26, 2011 for corresponding CN Application No. 200910172033.3.

(Continued)

*Primary Examiner* — Jane Rhee
(74) *Attorney, Agent, or Firm* — Knobbe, Martens, Olson & Bear, LLP

(57) ABSTRACT

A protection circuit board, a secondary battery with the protection circuit board, and a battery pack comprising the secondary battery.

A PTC device which is a secondary protection device is provided on the protection circuit board, and is installed in electrical connection with an electrode terminal of a bare cell of the secondary battery. According to a structural configuration where the PTC device is electrically connected to the bare cell while being installed on the protection circuit board, the PTC device sensitively responds to temperature changes of the bare cell to thereby cut off a flow of electric current. Due to such a structural configuration of the PTC device, formation of an electrode lead is excluded for electrical connection with the bare cell on the protection circuit board. Consequently, a pattern-forming area which is designed on the protection circuit board increases.

23 Claims, 6 Drawing Sheets

(56) References Cited

FOREIGN PATENT DOCUMENTS

| | | |
|---|---|---|
| JP | 2003-017026 | 1/2003 |
| JP | 2003-022790 A | 1/2003 |
| JP | 2004-022524 | 1/2004 |
| JP | 2005-183176 | 7/2005 |
| JP | 2005-183176 A | 7/2005 |
| JP | 2006-040893 A | 2/2006 |
| JP | 2006-093132 A | 4/2006 |
| JP | 2007-035622 A | 2/2007 |
| JP | 2009-123700 A | 6/2009 |
| KR | 1020050115218 | 12/2005 |
| KR | 100614401 | 8/2006 |
| KR | 1020070012937 | 1/2007 |
| KR | 1020080045946 | 5/2008 |
| KR | 100851963 | 8/2008 |

OTHER PUBLICATIONS

Office Action dated Jan. 11, 2011 for corresponding KR Application No. 10-2009-0083195.

Office Action dated Jul. 3, 2012 for corresponding JP Application No. 2009-203681.

Office Action dated Jul. 30, 2013 for corresponding JP Application No. 2009-203681.

PROTECTION CIRCUIT BOARD, SECONDARY BATTERY AND BATTERY PACK

RELATED APPLICATIONS

This application claims the benefit of U.S. Provisional Application No. 61/093,958 filed Sep. 3, 2008, entitled PROTECTION CIRCUIT BOARD, SECONDARY BATTERY AND BATTERY PACK, which is hereby incorporated by reference in its entirety herein.

BACKGROUND OF THE INVENTION

1. Field of the Invention

The present invention relates to a secondary battery. More specifically, the present invention relates to a protection circuit board with a PTC device, a secondary battery having the same protection circuit board, and a battery pack comprising the same secondary battery.

2. Description of the Related Art

A secondary battery is a battery capable of repeated use after recharging the battery. The secondary battery has broad spectrum of applications for portable multi-function equipment such as mobile phones, notebook computers, camcorders, and the like.

The secondary battery is composed of a bare cell including a can, an electrode assembly housed inside the can, and a cap assembly assembled with the can. The battery pack is configured by provision of a protection circuit board that is electrically connected to the bare cell. A protection circuit provided on the protection circuit board serves to control charge/discharge of the bare cell.

Between the battery cell and the protection circuit board is provided a protection device such as positive temperature coefficient (PTC) device, thermal fuse, or the like. This safety device is called a secondary protection device, apart from a primary protection device that is provided in the battery cell. The secondary protection device is electrically connected to the bare cell to thereby cut off the flow of electrical current to the outside, when the battery rises to a high temperature or a disturbance of a preset voltage takes place due to excessive charge/discharge. That is, the secondary protection device serves to prevent damage and deterioration of the battery. Such a secondary protection device is usually installed in the bare cell and sensitively responds to temperature changes in the bare cell.

A PTC device, which has been primarily used as the secondary protection device, is now installed in the form of a single component on the protection circuit board. Such a protection circuit board is advantageous in terms of simplified manufacturing processes, but suffers from a variety of shortcomings which will be specifically described as follows.

The protection circuit board is installed with the PTC device in the form of a single component, and therefore the PTC device is not in direct connection with the bare cell. In other words, the PTC device is connected to the bare cell through the protection circuit board, so its heat transfer efficiency is low, which consequently results in performance deterioration of the secondary protection device.

In addition, the protection circuit board should have an electrode lead so as to be electrically connected to the bare cell. Then, a pattern design area is decreased correspondingly to an installation area of the electrode lead that is formed on the protection circuit board. Consequently, the protection circuit board should employ a multi-layered circuit board (at least Layered or more) in order to ensure a predetermined pattern-forming area, thereby increasing the production costs.

Further, the protection circuit board has problem with increasing internal resistance due to the PTC device.

BRIEF SUMMARY OF THE INVENTION

Therefore, the present invention has been made in view of the above problems, and it is an object of the present invention to provide a protection circuit board with a secondary protection device that is electrically connected to an electrode terminal of a bare cell.

It is another object of the present invention to provide a secondary battery with the aforesaid protection circuit board.

It is still another object of the present invention to provide a battery pack comprising the aforesaid secondary battery.

It is still another object of the present invention to provide a battery pack comprising a protection circuit assembly for a battery assembly that includes a bare cell having at least one electrode, the protection circuit assembly comprising a protection circuit board adapted to control the charge and discharge of the bare cell, a positive temperature coefficient (PTC) assembly that includes a PTC main body, a first lead and a second lead wherein the first lead attaches the PTC main body to the protection circuit board wherein the second lead is adapted to allow the PTC main body to be subsequently connected to the at least one electrode of the bare cell.

It is still another object of the present invention to provide a battery pack comprising a method of coupling a protection circuit assembly to a bare cell of a battery assembly, the method comprising electrically connecting a positive temperature coefficient (PTC) component to a protection circuit board via a first lead of the PTC component and electrically connecting the PTC component to at least one electrode of the bare cell via a second lead of the PTC component subsequent to electrically connecting the PTC component to the protection circuit board

BRIEF DESCRIPTION OF THE DRAWINGS

Common reference numerals are used throughout the drawings and the detailed description to indicate the same elements.

DETAILED DESCRIPTION OF THE INVENTION

First, one embodiment of a protection circuit board according to the present invention as described above will be illustrated with reference to the accompanying drawings.

Figure 1A:
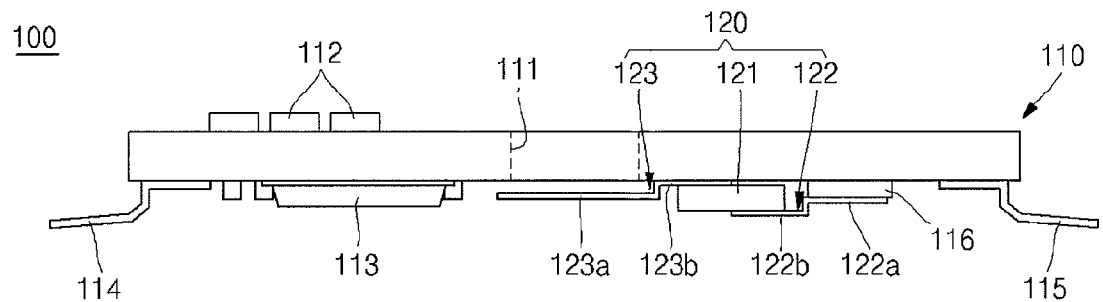
FIG. 1A is a side view of a protection circuit board according to one embodiment of the present invention.
Figure 1B:
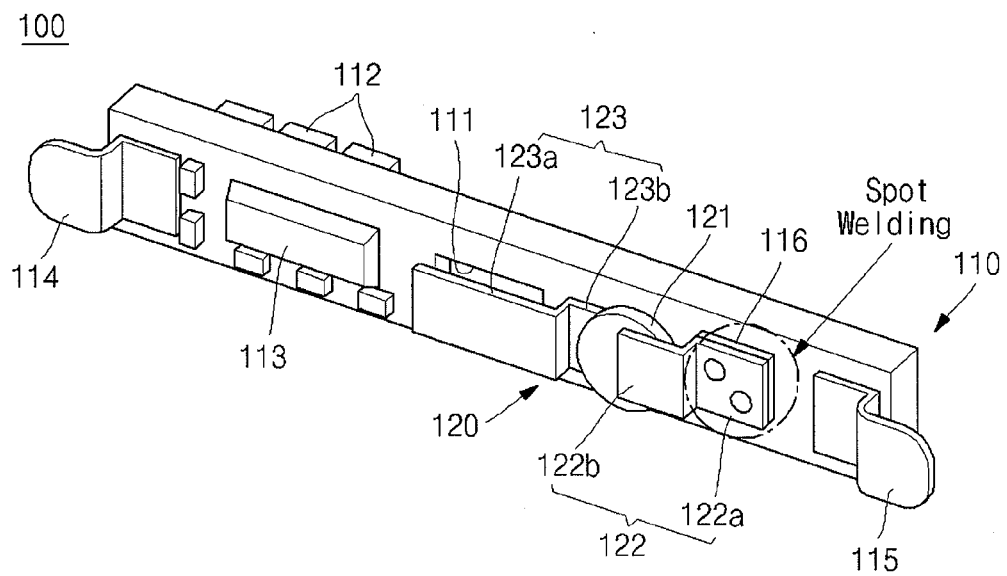
FIG. 1B is a perspective view of FIG. 1A.
Figure 1C:
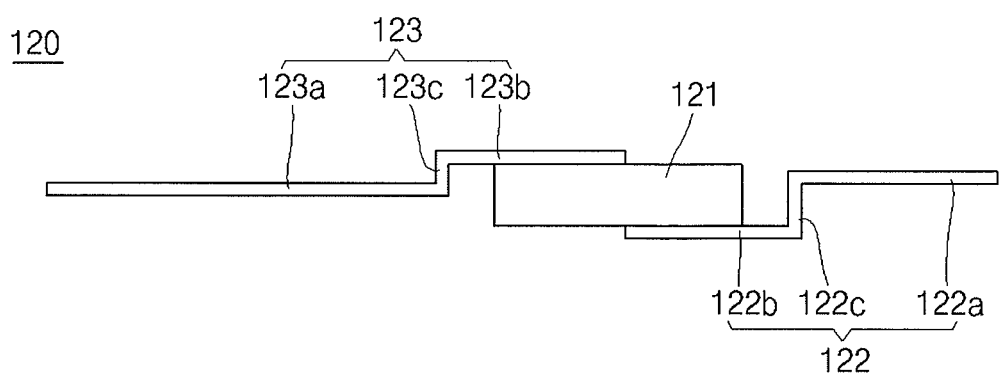
FIG. 1C is a side view of a PTC device provided on a protection circuit board according to one embodiment of the present invention.

FIG. 1A is a side view of a protection circuit board according to one embodiment of the present invention, FIG. 1B is a perspective view of FIG. 1A, and FIG. 1C is a side view of a PTC device according to one embodiment of the present invention.

Referring to FIGS. 1A to 1C, a protection circuit board 100 according to one embodiment of the present invention includes a main body 110 and a PTC device 120 installed on the main body 110.

A welding hole 111 is formed at the center of the main body 110. An upper part of the main body 110 is installed with external terminals 112 for transmitting electric current to the outside, and a lower part of the main body 110 is installed with a variety of electrical devices 113. In addition, positive electrode leads 114,115 are provided on lower surfaces of both end portions of the main body 110. The positive electrode leads 114,115 are formed to bend and extend from the main body 110 such that these leads are exposed to the outside to be welded.

The PTC device 120 includes a PTC main body 121, a first conductive plate 122 connected to one side of the PTC main body 121, and a second conductive plate 123 connected to the other side of the PTC main body 121.

The PTC main body 121 is prepared by dispersing conductive particles in a crystalline polymer. The conductive particles may be carbon particles, and the crystalline polymer may be a synthetic resin such as polyolefin resin, or the like. The PTC main body 121 serves to connect a flow of electric current between the first conductive plate 122 and the second conductive plate 123, since the conductive particles aggregate together below a predeterminate temperature. On the other hand, when the PTC main body 121 is exposed to a high temperature above the preset temperature, separation of conductive particles due to swelling of the crystalline polymer results in a rapid increase of resistance which consequently leads to blocking of an electric current flow or a low flow of electric current. In this manner, the PTC main body 121 plays a role as a safety device for preventing damage of the battery. Elevation of a battery temperature above the specified range is due to heat generation resulting from a flow of overcurrent or overvoltage or increased power consumption during use of the battery. When the PTC main body 121 is then cooled below the preset temperature, the crystalline polymer shrinks, which leads to reconnection between the conductive particles, thus eliciting a flow of electric current.

The first conductive plate 122 includes a first conductive portion 122a connected to the main body 110, a second conductive portion 122b connected to the PTC main body 121, and a connection portion 122c for connection of the first conductive portion 122a to the second conductive portion 122b. The connection portion 122c is vertically formed to provide a height difference between the first conductive portion 122a and the second conductive portion 122b.

The second conductive plate 123 includes a first conductive portion 123a connected to an electrode terminal of a bare cell which will be illustrated hereinafter, a second conductive portion 123b connected to the PTC main body 121, and a connection portion 123c for connection of the first conductive portion 123a to the second conductive portion 123b. The connection portion 123c is vertically formed to provide a height difference between the first conductive portion 123a and the second conductive portion 123b.

The protection circuit board 100 according to one embodiment of the present invention is installed in a manner that the PTC device 120 is spot-welded to the main body 110. A nickel conductive layer 116 is installed on the lower surface of the main body 110, and the PTC device 120 is electrically connected as a first conductive portion 122a of a first conductive plate 122 is spot-welded to the conductive layer 116.

In the protection circuit board 100 according to one embodiment of the present invention as constructed above, the first conductive plate 122 of the PTC device 120 is connected to the main body 110 by a spot-welding method such as resistance welding, and the second conductive plate 123 is connected to a negative electrode terminal (not shown) of the bare cell by a resistance welding method. In this manner, the PTC device is installed with the first conductive plate 122 and the second conductive plate 123 being welded, respectively. Therefore, such a structural configuration does not have significant thermal effects on the PTC main body 121 connected to the first and second conductive plates 122,123. As such, the PTC main body 121 is installed being less susceptible to thermal effects, so performance of the PTC device 120 is improved.

The PTC device 120 is installed on the main body 110 of the protection circuit board 100 and is also electrically connected to the electrode terminal of the bare cell. Therefore, transfer efficiency of heat from the bare cell to the PTC device 120 is improved which result in improved safety performance of the PTC device 120.

The PTC device 120 serves as an electrical connection path in order to be connected to the electrode terminal of the bare cell, so that the main body 110 does not need an electrode lead which is connected to the electrode terminal of the bare cell. As a result, a pattern-forming area on the main body 110 increases.

Hereinafter, a protection circuit board according to another embodiment of the present invention will be illustrated.

Figure 2A:
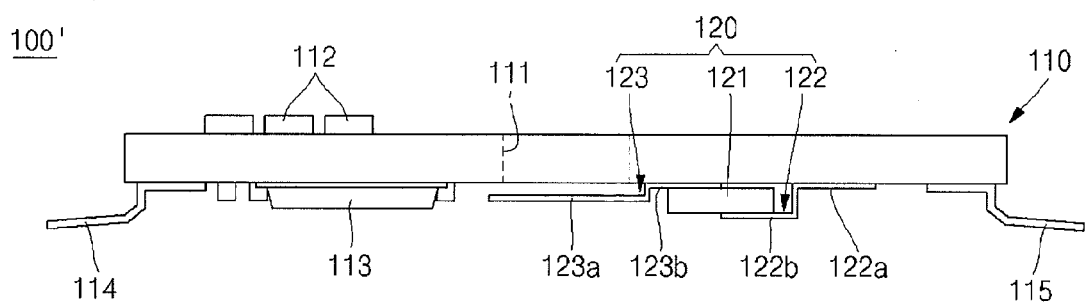
FIG. 2A is a side view of a protection circuit board according to another embodiment of the present invention.
Figure 2B:
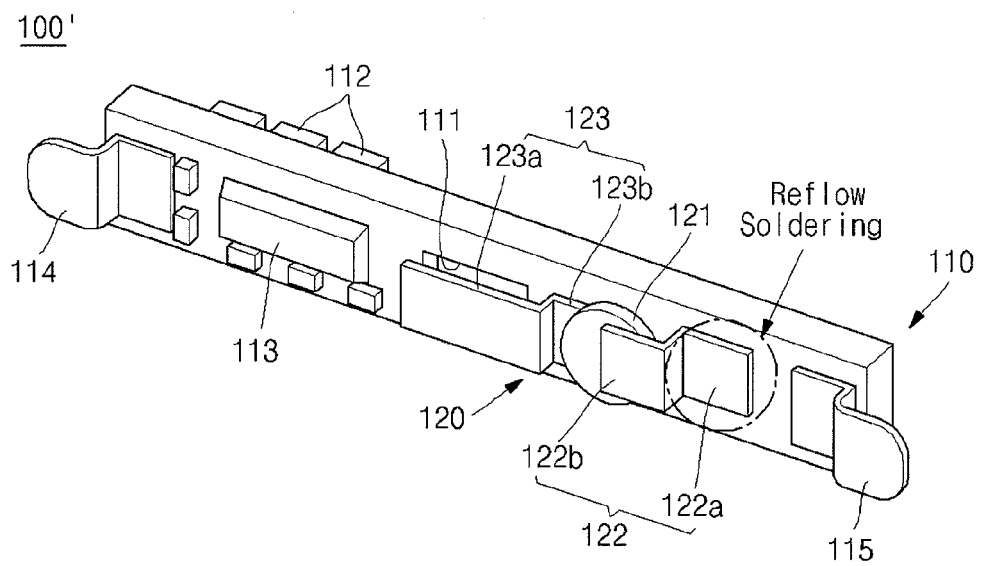
FIG. 2B is a perspective view of FIG. 2A.

FIG. 2A is a side view of a protection circuit board according to another embodiment of the present invention, and FIG. 2B is a perspective view of FIG. 2A.

Referring to FIGS. 2A and 2B, a protection circuit board 100' includes a main body 110 and a PTC device 120 installed on the main body 110.

As such, the main body 110 and PTC device 120 in the protection circuit board 100' according to another embodiment of the present invention have the same configuration as that of one embodiment of the present invention. Like numbers refer to like elements throughout the specification and drawings, so details thereof will be omitted herein.

The difference between two different embodiments, i.e. the protection circuit boards 100' and 100 is related to an installation manner of the PTC device 120 relative to the main body 110.

That is, the PTC device 120 of the protection circuit board 100' is installed relative to the main body 110 by a reflow soldering method. According to the reflow soldering method, a solder cream is first applied to the main body 110, and the protection circuit board 100' is then passed through a reflow soldering machine to thereby apply hot air or light to the interface region where the PTC device 120 and the main body 110 are joined. Then, the solder cream applied to the main body 110 is melted, the PTC device 120 is attached to the main body 110.

The PTC device 120 attached to the main body 110 is connected by reflow soldering of a first conductive portion 122a of the first conductive plate 122. As a result, there is no need for formation of the conductive layer 116 on the lower surface of the main body 110.

As described above, in the protection circuit board 100' according to another embodiment of the present invention, the first conductive plate 122 of the PTC device 120 is connected to the main body 110 by a reflow soldering method, and the second conductive plate 123 of the PTC device 120 is connected to an electrode terminal (not shown) of the bare cell by a welding method such as resistance welding. Joining of different parts by the reflow soldering provides various advantages such as no need for formation of a separate conductive layer on the main body 110, and design feasibility of industrial-scale manufacturing processes and process automation.

The PTC device 120 installed on the protection circuit board 100' is electrically connected directly to the electrode terminal of the bare cell, so such a structural configuration results in improvement of heat transfer efficiency.

In addition, according to the protection circuit board 100', the electrode terminal of the bare cell is connected by the PTC device 120, so a separate electrode lead connected to the electrode terminal of the bare cell is not provided on the protection circuit board 100'. As a result, an area of a pattern on the main body 110 increases.

Hereinafter, a secondary battery according to the present invention will be described.

Figure 3:
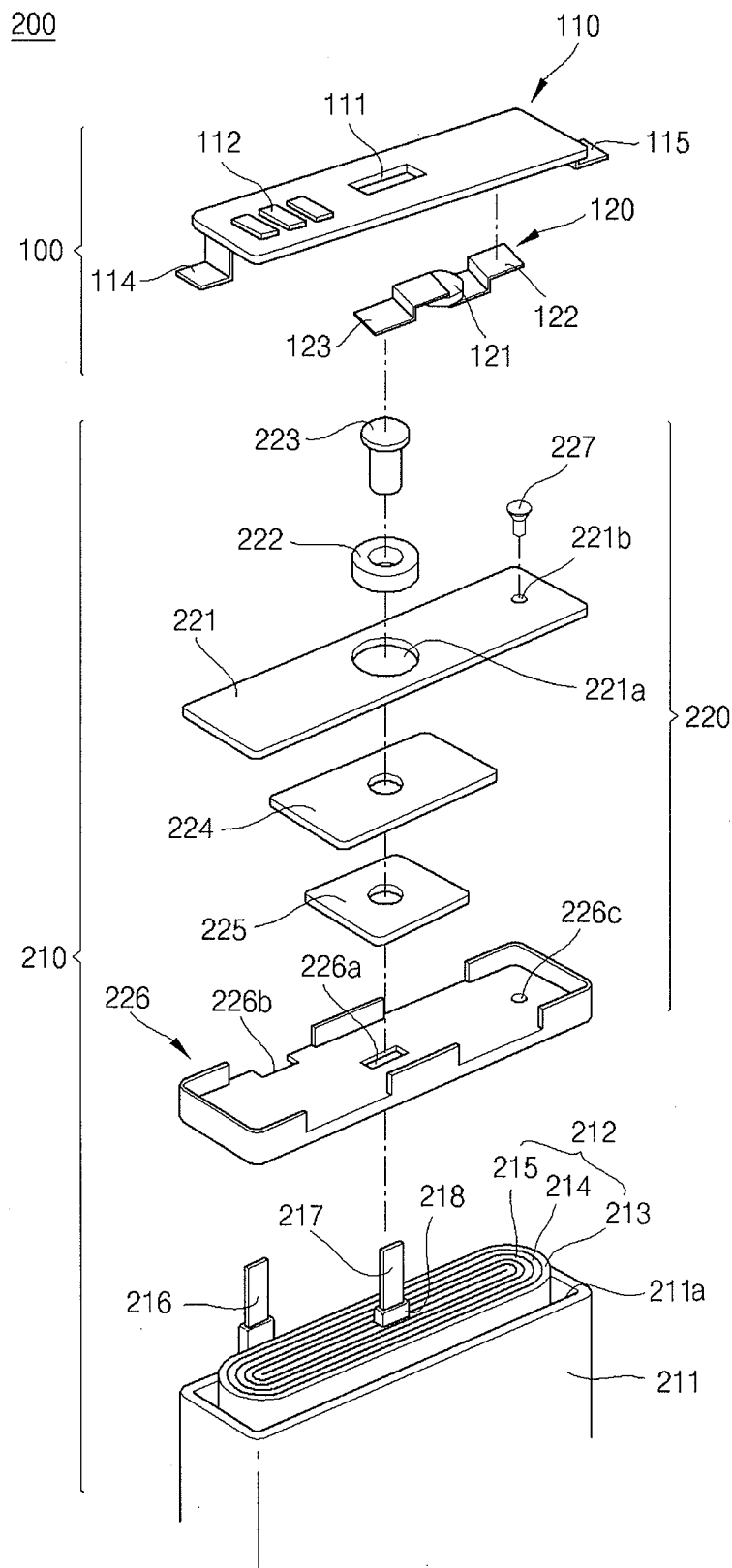
FIG. 3 is an exploded perspective view of a secondary battery according to the present invention.
Figure 4:
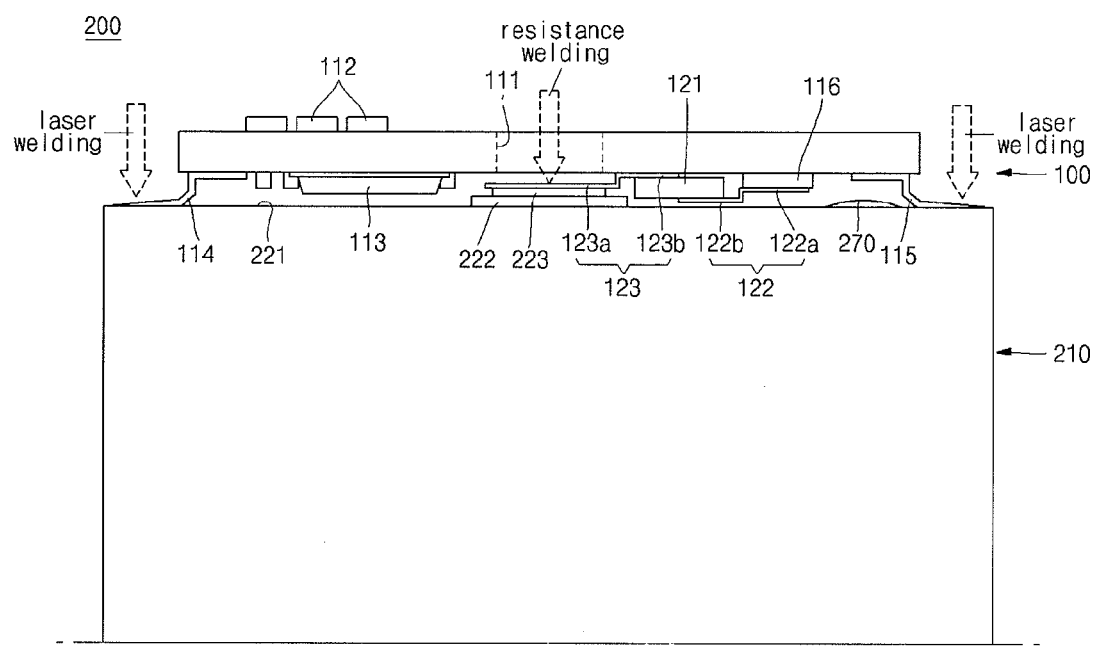
FIG. 4 is a view illustrating a welding state of a protection circuit board to a bare cell in a secondary battery according to the present invention.

FIG. 3 is an exploded perspective view of a secondary battery according to the present invention, and FIG. 4 is a view illustrating a welding state of a protection circuit board to a bare cell in a secondary battery according to the present invention.

Referring to FIGS. 3 and 4, a secondary battery 200 according to the present invention includes a bare cell 210 and a protection circuit board 100 electrically connected to the bare cell 210. The protection circuit board 100 includes a main body 110 with a PTC device 120. In this connection, the protection circuit board 100 has the same configuration as that of one embodiment of the present invention. Like numbers refer to like elements in the previous embodiment.

The bare cell 210 includes a can 211, an electrode assembly 212 housed in the can 211, and a cap assembly 220 for sealing an open upper part of the can 211.

The can 211 is a generally rectangular-shaped container made of metal, which has an open upper part 211a and is formed by a processing method such as deep drawing. Therefore, the can 211 can also serve as a terminal. The can 211 may be preferably formed of an aluminum or aluminum alloy that is a light-weight conductive metal. The can 211 serves as a container of an electrode assembly 212 and an electrolyte, and the open upper part 211a to allow insertion of the electrode assembly 212 is hermetically sealed by the cap assembly 220.

The electrode assembly 212 includes a positive electrode plate 213, a separator 214, a negative electrode plate 215, a positive electrode tab 216 drawn from the positive electrode plate 213, a negative electrode tab 217 drawn from the negative electrode plate 215, and an insulating tape 218 attached to the positive electrode tab 216 and the negative electrode tab 217.

The electrode assembly 212 may be prepared by stacking the positive electrode plate 213, the negative electrode plate 215 and the separator 214 disposed therebetween and spirally winding the resulting stacked structure into a jelly roll shape. The positive electrode plate 213 may be formed by coating lithium cobalt oxide ($LiCoO_2$) as a positive electrode active material on a positive electrode current collector consisting of aluminum and the negative electrode plate 215 may be formed by coating carbon as a negative electrode active material on a negative electrode current collector consisting of copper foil. The separator 214 is formed of polyethylene, polypropylene or a copolymer thereof. The separator 214 is formed to have a width larger than that of the positive electrode plate 213 and the negative electrode plate 215, which is advantageous for prevention of electrical short circuit that may possibly occur between the electrode plates.

The positive electrode tab 216 connected to the positive electrode plate 213 and the negative electrode tab 217 connected to the negative electrode plate 215 are drawn upward from the electrode assembly 212. In order to prevent electrical short circuit that may possibly occur between the positive electrode plate 213 and the negative electrode plate 215, the interface region drawn outward from the electrode assembly 212 is wound by the insulating tape 218.

The cap assembly 220 includes a cap plate 221, a gasket 222, an electrode terminal 223, an insulation plate 224, a terminal plate 225, and an insulating case 226.

The cap plate 221 includes a terminal through-hole 221a formed at the center thereof. The terminal through-hole 221a provides a path through which the electrode terminal 223 is inserted. On the outer periphery of the electrode terminal 223 is positioned a gasket 222 for providing electrical insulation between the cap plate 221 and the electrode terminal 223. One side of the cap plate 221 is provided with an electrolyte injection hole 221b for injection of an electrolyte into the can 211. After injection of the electrolyte is complete, the electrolyte injection hole 221b is sealed with a plug 227.

The electrode terminal 223 is electrically connected to the negative electrode tab 217 to thereby serve as a negative electrode terminal. However, when the electrode terminal 223 is connected to the positive electrode tab 216, it serves as a positive electrode terminal with electrically opposite polarity. Conventionally, the electrode terminal 223 plays a role as a negative electrode terminal.

The insulating plate 224 is formed below the cap plate 221 and a terminal plate 225 is provided below the insulating plate 224. Therefore, the insulating plate 224 provides insulation between the cap plate 221 and the terminal plate 225.

Meanwhile, the terminal plate 225 is coupled with a lower end of the electrode terminal 223. The negative electrode plate 215 of the electrode assembly 212 is electrically connected to the terminal plate 225 and the electrode terminal 223 through the negative electrode tab 217. Further, the positive electrode plate 213 of the electrode assembly 212 is electrically connected to a lower surface of the cap plate 221 through the positive electrode tab 216.

The insulating case 226 is disposed on an upper surface of the electrode assembly 212. The insulating case 226 includes a negative electrode tab pass-through portion 226a, a positive electrode tab pass-through portion 226b and an electrolyte inlet 226c.

The plug 227 is used to hermetically seal the electrolyte injection hole 221b after injection of an electrolyte into the can 211 through the hole 221b formed on the cap plate 221.

A secondary battery 200 according to the present invention as constructed above is fabricated with electrical connection of the protection circuit board 100 to the bare cell 210.

In the protection circuit board 100, a first conductive plate 122 of the PTC device 120 is connected to the conductive layer 116 formed on a lower surface of the main body 110 by a spot-welding method such as resistance welding. Alternatively, the first conductive plate 122 of the PTC device 120 may be connected to a lower surface of the protection circuit board 100'☐ by a reflow soldering method, when the conductive layer 116 was not formed on the lower surface of the main body 110.

Further, a second conductive plate 123 of the PTC device 120 is connected to the electrode terminal 223 of the bare cell 210 by a resistance welding method. According to such a welding process, a welding rod passes through a welding hole 111 formed on the main body 110 to thereby result in welding of a contact surface between the second conductive plate 123 and the electrode terminal 223 of the bare cell 210. Usually, the electrode terminal 223 serves as a negative electrode terminal of the bare cell 210.

When the electrode terminal 223 is a negative electrode terminal, the cap plate 221 plays a role as a positive electrode terminal of the bare cell 210. Both upper sides of the cap plate 221 are provided with positive electrode leads 114,115 being fixed to both lower sides of the main body 110. That is, the positive electrode leads 114,115 are laser-welded to the upper surface of the cap plate 221 to thereby provide electrical connection between the cap plate 221 and the main body 110. In this connection, at least one of the positive electrode leads 114,115 is electrically connected to a positive electrode terminal of the main body 110.

In this manner, the protection circuit board 100 is electrically connected to the negative electrode terminal 223 of the bare cell 210 through the PTC device 120, and the positive electrode terminal 221 is electrically connected through the positive electrode leads 114,115. As a result, the protection circuit board 100 has a structural configuration where the bare cell 210, the positive electrode and the negative electrode are electrically connected.

Here, the PTC device 120 is installed on the path where electric current flows between the protection circuit board 100 and the bare cell 210, and therefore cuts off a flow of electric current to thereby prevent explosion or ignition of the battery when the secondary battery 200 is internally or externally exposed to heat.

Further, the secondary battery 200 according to the present invention is capable of improving transfer efficiency of heat from the bare cell 210 to the PTC device 120, through provision of the protection circuit board 100 or 100' having the PTC device 120.

Further, the PTC device 120 serves as an electrical connection path for connection with the electrode terminal 223 of the bare cell 210, so the main body 110 does not need installation of a separate electrode lead that is connected to the electrode terminal 223 of the bare cell 210. As a result, an area for a pattern can be formed on the main body 110 increases.

Hereinafter, a battery pack according to another embodiment of the present invention will be illustrated.

Figure 5:
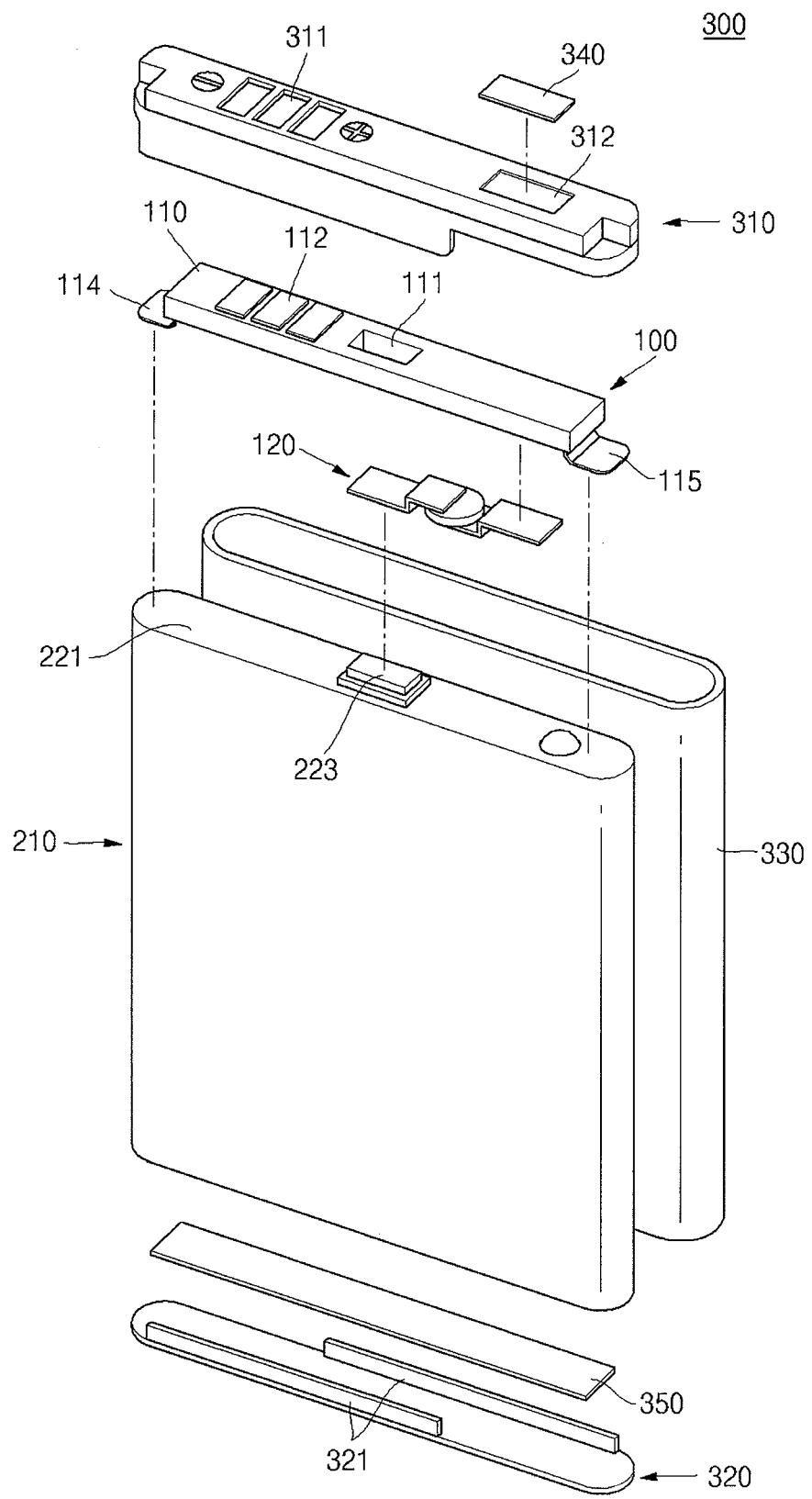
FIG. 5 is an exploded perspective view of a battery pack according to the present invention.

FIG. 5 is a perspective view of a battery pack comprising a secondary battery according to the present invention.

Referring to FIG. 5, a battery pack 300 according to the present invention includes a bare cell 210, a protection circuit board 100 electrically connected to the bare cell 210, a top case 310 for connection between the protection circuit board 100 and an upper surface of the bare cell 210, a bottom case 320 connected to a lower surface of the bare cell 210, and a label paper 330 which connects the top case 310 and the bottom case 320 to the bare cell 210 and surrounds to protect lateral sides of the bare cell 210.

The top case 310 has an open-bottomed rectangular shape with an internal space having a size enough to accommodate the protection circuit board 100. On side of the top case 310 are provided terminal through-holes 311 through which external terminals 112 of the protection circuit board 100 are exposed. The other side of the top case 310 is provided a water-sensitive label-attaching portion 312 to which a water-sensitive label 340 is attached.

Both lateral sides of the bottom case 320 are provided with side ribs 321 which support lower lateral sides of the bare cell 210.

A double-sided tape 350 is disposed between the bare cell 210 and the bottom case 320, such that the lower surface of the bare cell 210 and the upper surface of the bottom case 320 are adhered to each other. Therefore, the bottom case 320 is combined to the lower end of the bare cell 210.

The label paper 330 surrounds the lateral sides of the bare cell 210 while covering the lower end of the top case 310 and side ribs 321 of the bottom case 320.

In the thus-configured battery pack 300 according to the present invention, the bare cell 210 and the protection circuit board 100 are electrically connected to each other. Here, a negative electrode terminal 223 of the bare cell 210 is connected to the PTC device 120 to thereby be connected with a negative electrode terminal (not shown) of the protection circuit board 100. Further, a cap plate 221 which is a positive electrode terminal of the bare cell 210 is connected to a positive electrode terminal (not shown) of the protection circuit board 100 through positive electrode leads 114,115 of the protection circuit board 100.

In this manner, the PTC device 120 provided on the protection circuit board 100 directly receives delivery of heat through the negative electrode terminal 223 of the bare cell 210. As a consequence, the PTC device 120 interrupts a flow of electric current to thereby prevent possible explosion or ignition of the battery pack 300 upon the occurrence of malfunctions due to overheating of the battery.

In addition, the PTC device 120 serves as an electrical connection path for connection with the electrode terminal 223 of the bare cell 210, and therefore the main body 110 does not require installation of a separate electrode lead connected to the electrode terminal 223 of the bare cell 210. For this reason, a pattern-forming area of the main body 110 advantageously increases.

As apparent from the above description, the protection circuit board according to the present invention is capable of improving safety performance of a battery by provision of a secondary protection device which is electrically connected to an electrode terminal of a bare cell.

Further, the protection circuit board according to the present invention is capable of achieving a decreased internal resistance of a device by minimizing an installation area of the secondary protection device which is provided on the protection circuit board.

Further, the protection circuit board according to the present invention is capable of achieving an increased installation area of a pattern formed on the protection circuit board, because the secondary protection device plays a role as a negative electrode lead. Accordingly, design of a desired pattern is possible even with use of a bilayer circuit board, thus resulting in significant product cost saving, whereas a conventional protection circuit board requires a four-layered circuit board to accomplish the same effects.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A protection circuit assembly for a battery assembly that includes a bare cell having at least one electrode, the protection circuit assembly comprising:
 a protection circuit board adapted to control the charge and discharge of the bare cell; and
 a positive temperature coefficient (PTC) assembly that includes a PTC main body having a first surface and a second surface, a first lead and a second lead wherein the first lead attaches the first surface of the PTC main body to the protection circuit board wherein the second lead is adapted to allow the second surface of the PTC main body to be subsequently connected to the at least one electrode of the bare cell and wherein the first surface of the PTC main body is positioned adjacent the bare cell so that the first lead is attached to the first surface so as to be interposed between the bare cell and the PTC main body and wherein the second surface of the PTC main body is positioned adjacent the protection circuit board so that the second lead is attached to the second surface of the PTC main body so as to be interposed between the protection circuit board and the PTC main body, wherein the first lead and the second lead comprise a first conductive portion, a second conductive portion and a connection portion for connection of the first conductive portion to the second conductive portion, respectively, wherein the connection portion is vertically formed to provide a height difference between the first conductive portion and the second conductive portion.

2. The assembly of claim 1, wherein the first lead is contoured to retain the PTC main body to the protection circuit module.

3. The protection circuit assembly of claim 1, further comprising a conductive layer positioned on the protection circuit board wherein the first lead is electrically coupled to the protection circuit board via spot-welding to the conductive layer.

4. The protection circuit assembly of claim 3, wherein the conductive layer comprises a nickel conductive layer.

5. The protection circuit assembly of claim 1, wherein the first lead is connected to the protection circuit board via reflow soldering.

6. The protection circuit assembly of claim 1, wherein the first lead comprises a first conductive portion that is electrically coupled to the protection circuit board, a second conductive portion that is electrically coupled to a first surface of the main body of the PTC and a third portion, that is interposed between the first and the second portions so as to space the first and second portions apart.

7. The protection circuit assembly of claim 6, wherein the second lead comprises a first conductive portion that is adapted to be electrically coupled to the at least one electrode of the bare cell, a second conductive portion that is electrically coupled to a second surface of the main body of the PTC and a third portion, that is interposed between the first and the second portions so as to space the first and second portions apart.

8. The protection circuit assembly of claim 7, wherein the PTC main body has an inner surface and an outer surface and is positioned proximate the protection circuit board with the second portion of the second lead being interposed between inner surface of the PTC main body and the protection circuit board and the second portion of the first lead being coupled to the outer surface of the PTC main body.

9. A battery assembly comprising:
a bare cell;
a protection circuit board adapted to control the charge and discharge of the bare cell; and
a positive temperature coefficient (PTC) assembly that includes a PTC main body having a first and a second surface, a first lead that electrically couples the first surface of the PTC main body to the protection circuit board and a second lead that electrically couples the second surface of the PTC main body to the electrode of the bare cell so that the PTC main body is electrically interposed between the bare cell and the protection circuit board wherein the first surface of the PTC main body is positioned adjacent the bare cell so that the first lead is attached to the first surface so as to be interposed between the bare cell and the PTC main body and wherein the second surface of the PTC main body is positioned adjacent the protection circuit board so that the second lead is attached to the second surface of the PTC main body so as to be interposed between the protection circuit board and the PTC main body, wherein the first lead and the second lead comprise a first conductive portion, a second conductive portion and a connection portion for connection of the first conductive portion to the second conductive portion, respectively, wherein the connection portion is vertically formed to provide a height difference between the first conductive portion and the second conductive portion.

10. The battery assembly of claim 9, the bare cell comprising:
an electrode assembly having a first and a second electrode with a separator interposed therebetween, and a first and a second tab respectively coupled to the first and second electrodes;
a casing having an opening wherein the electrode assembly is positioned within the casing; and
a cap assembly that is coupled to the casing wherein the cap assembly includes a battery electrode that is electrically coupled to at least one of the first or second tabs.

11. The battery assembly of claim 9, further including a top case for connecting between the protection circuit board and the bare cell.

12. The battery assembly of claim 9, further comprising a conductive layer positioned on the protection circuit board wherein the first lead is electrically coupled to the protection circuit board via spot-welding to the conductive layer.

13. The battery assembly of claim 12, wherein the conductive layer comprises a nickel conductive layer.

14. The battery assembly of claim 9, wherein the first lead is connected to the protection circuit board via reflow soldering.

15. The battery assembly of claim 9, wherein the protection circuit board includes a main body that has a welding hole that is formed at the center of the main body.

16. The battery assembly of claim 15, wherein the second lead of the PTC assembly is connected to a negative electrode terminal of the bare cell by resistance welding through the welding hole of the protection circuit board.

17. The battery assembly of claim 9, wherein the protection circuit board includes a main body having an electrode leads provided at both end portions of the main body.

18. The battery assembly of claim 17, wherein electrode leads of the protection circuit board are laser welded to the upper surface of the bare cell.

19. A method of coupling a protection circuit assembly to a bare cell of a battery assembly, the method comprising:
electrically connecting a first surface of a positive temperature coefficient (PTC) component to a protection circuit board via a first lead of the PTC component;
electrically connecting a second surface of the PTC component to at least one electrode of the bare cell via a second lead of the PTC component, subsequent to electrically connecting the PTC component to the protection circuit board wherein the first surface of the PTC component is positioned adjacent the bare cell so that the first lead is attached to the first surface so as to be interposed between the bare cell and the PTC main body and the second surface of the PTC component is positioned adjacent the protection circuit board so that the second lead is attached to the second surface of the PTC main body so as to be interposed between the protection circuit board and the PTC main body, wherein the first lead and the second lead comprise a first conductive portion, a second conductive portion and a connection portion for connection of the first conductive portion to the second conductive portion, respectively, wherein the connection portion is vertically formed to provide a height difference between the first conductive portion and the second conductive portion.

20. The method of claim 19, wherein electrically connecting the first lead of the PTC component to the protection circuit board comprises spot welding the second portion to a conductive layer formed on the protection circuit board.

21. The method of claim 19, wherein electrically connecting the first lead of the PTC component to the protection circuit board comprises reflow soldering the second portion directly to the protection circuit board.

22. The method of claim 19, wherein electrically connecting the second lead of the PTC component to at least one electrode of the bare cell comprises resistance welding through a welding hole of the protection circuit board.

23. The method of claim 19, wherein electrically connecting the electrode leads of the protection circuit board to another electrode of the bare cell comprises laser welding.

* * * * *